US011388392B2

(12) United States Patent
Miki et al.

(10) Patent No.: US 11,388,392 B2
(45) Date of Patent: Jul. 12, 2022

(54) INFORMATION PROCESSING APPARATUS AND MEASURABLE REGION SIMULATION METHOD

(71) Applicant: HITACHI, LTD., Tokyo (JP)

(72) Inventors: Ryosuke Miki, Tokyo (JP); So Sasatani, Tokyo (JP); Hideyuki Kume, Tokyo (JP); Masaya Itoh, Tokyo (JP)

(73) Assignee: HITACHI, LTD., Tokyo (JP)

( * ) Notice: Subject to any disclaimer, the term of this patent is extended or adjusted under 35 U.S.C. 154(b) by 89 days.

(21) Appl. No.: 16/766,833

(22) PCT Filed: Dec. 15, 2017

(86) PCT No.: PCT/JP2017/045120
§ 371 (c)(1),
(2) Date: May 26, 2020

(87) PCT Pub. No.: WO2019/116541
PCT Pub. Date: Jun. 20, 2019

(65) Prior Publication Data
US 2021/0368161 A1    Nov. 25, 2021

(51) Int. Cl.
*H04N 17/00* (2006.01)
*H04N 17/02* (2006.01)
*G06T 15/20* (2011.01)

(52) U.S. Cl.
CPC .......... *H04N 17/002* (2013.01); *G06T 15/20* (2013.01)

(58) Field of Classification Search
CPC ........ H04N 7/18; H04N 17/002; H04N 5/225; H04N 5/247; G06T 15/20
(Continued)

(56) References Cited

U.S. PATENT DOCUMENTS 9,282,296 B2 *   3/2016  Gao ................. H04N 7/181
10,306,185 B2 *  5/2019  Cho ................. H04N 7/181
(Continued)

FOREIGN PATENT DOCUMENTS

JP    2012-010210 A    1/2012
JP    2014-074948 A    4/2014
(Continued)

OTHER PUBLICATIONS

International Search Report with English translation and Written Opinion issued in corresponding application No. PCT/JP2017/045120 dated Feb. 13, 2018.

*Primary Examiner* — Trang U Tran
(74) *Attorney, Agent, or Firm* — Foley & Lardner LLP

(57) ABSTRACT

An information processing apparatus simulates a measurable region of a sensor when the sensor is arranged in a measurement region to be measured, and the information processing apparatus includes: a generation unit that generates a measurement region map with environment information based on a three-dimensional model of the measurement region to be measured and the environment information that causes a change in a measurement result of the sensor; an execution unit that virtually arranges the sensor on the measurement region map with environment information generated by the generation unit, and simulates the measurable region of the sensor based on sensor information related to the measurable region of the sensor; and an output unit that outputs a result of simulation by the execution unit.

13 Claims, 12 Drawing Sheets

(58) Field of Classification Search
 USPC .......................................................... 348/187
 See application file for complete search history.

(56) References Cited

U.S. PATENT DOCUMENTS 10,762,349 B2 * 9/2020 Ghinamo .................. G06T 7/75
2011/0317016 A1 12/2011 Saeki

FOREIGN PATENT DOCUMENTS

| JP | 2017-207872 A | * | 11/2017 | ............. H04N 5/225 |
| JP | 2017-207872 A | | 11/2017 | |

\* cited by examiner

FIG. 6

MEASUREMENT ACCURACY INFORMATION FOR ENVIRONMENT

| CONDITION 1 RGB VALUE | CONDITION 2 TEXTURE | CONDITION 3 SPECULAR REFLECTION COEFFICIENT | ... | MEASUREMENT ACCURACY VARIATION AMOUNT |
|---|---|---|---|---|
| — | ▤ | | ... | -10% |
| (255,255,255) | ▤ | | ... | -20% |
| (128,128,128) | ▤ | | ... | -15% |
| ... | ... | | ... | ... |
| — | ▦ | | ... | -5% |
| (255,255,255) | ▦ | | ... | -15% |
| ... | ... | | ... | ... |

FIG. 9

| DETECTION TARGET OBJECT | SHAPE | OBJECT INFORMATION ||| 
| | | RGB VALUE | ... | TEXTURE |
|---|---|---|---|---|
| PERSON | | (255,255,255) | ... | |
| ... | ... | ... | ... | ... |
| CARGO | | (128,128,128) | ... | |

INFORMATION PROCESSING APPARATUS AND MEASURABLE REGION SIMULATION METHOD

TECHNICAL FIELD

The present invention relates to an information processing apparatus and a measurable region simulation method, and is suitably applied to, for example, an information processing apparatus that simulates a measurable region of a sensor, and a measurable region simulation method.

BACKGROUND ART

In recent years, smart sensors (hereinafter, sensors) such as monitoring cameras and infrared sensors have become widespread, and are widely used in human flow analysis systems, crime prevention systems, and the like. Applications of these systems using smart sensors range from small ones such as private homes and retail stores to large ones such as large commercial facilities and manufacturing factories.

The type, specification, number, and arrangement of sensors used when constructing such a system differ depending on user needs. Furthermore, such a sensor is generally equipped with a unique measurement algorithm, and the measurement result may change due to disturbance light, color information, and temperature in addition to specifications. For this reason, conventionally, an expert hears the needs of the user, and the expert determines the specifications and arrangement of the sensor with its own know-how.

However, when constructing a system combining a plurality of sensors, it is necessary to perform a procedure of requesting an expert for each sensor to conduct an investigation and discussing the arrangement by the experts of each sensor, so that there is a problem that costs increase and it is difficult for a user to accurately communicate needs to the expert.

Therefore, there is a need for a technology that allows a user who does not have expert knowledge of sensors to select a sensor that satisfies his or her needs and to determine an arrangement.

For example, there is disclosed a technology of determining the arrangement of a monitoring camera that satisfies user needs (see PTL 1). As a method thereof, a data set of a plurality of camera arrangement candidates is created based on the needs of the user, and the positions of the cameras to be arranged on the map of the monitoring region are calculated based on the created data set by a clustering method.

CITATION LIST

Patent Literature

PTL 1: JP 2012-10210 A

SUMMARY OF INVENTION

Technical Problem

According to the method described in PTL 1, it is possible to determine an arrangement position of a monitoring camera that satisfies user needs for a monitoring camera that can calculate a photographable range in advance.

However, the method described in PTL 1 cannot cope with a sensor whose measurement result changes due to the influence of the environment (for example, the amount of light).

For example, when detecting an object (for example, a person) from an image captured by a monocular camera, generally, based on appearance information of the object, luminance gradient information for each pixel or the like is extracted as a feature amount, and the object is detected by the clustering method or the like. At this time, if the surrounding light amount is strong and halation occurs in the measurement target, the feature amount cannot be extracted and the detection fails.

When irradiating a predetermined pattern on an object that reflects specularly, a three-dimensional sensor capable of irradiating the pattern and acquiring a three-dimensional shape of a measurement target from a change in the shape cannot acquire a change in the shape of the pattern, and cannot acquire the three-dimensional shape of the measurement target.

As described above, since the measurement results of the sensor change depending on environment conditions such as the shape of the region to be measured, color information, and the amount of light, there is a problem that, if the sensor arrangement is determined based on the ideal measurement results of the sensor, the system cannot satisfy user needs.

The present invention has been made in view of the above points, and has as its object to propose an information processing apparatus capable of simulating a measurable region in consideration of environment conditions.

Solution to Problem

In order to solve such a problem, in the present invention, an information processing apparatus simulates a measurable region of a sensor when the sensor is arranged in a measurement region to be measured, and the information processing apparatus includes: a generation unit that generates a measurement region map with environment information based on a three-dimensional model of the measurement region to be measured and environment information that causes a change in a measurement result of the sensor; an execution unit that virtually arranges the sensor on the measurement region map with environment information generated by the generation unit, and simulates the measurable region of the sensor based on sensor information related to the measurable region of the sensor; and an output unit that outputs a result of simulation by the execution unit.

Furthermore, in the present invention, a measurable region simulation method simulates a measurable region of a sensor when the sensor is arranged in a measurement region to be measured, the measurable region simulation method includes: a first step of, by a generation unit, generating a measurement region map with environment information based on a three-dimensional model of the measurement region to be measured and the environment information that causes a change in a measurement result of the sensor; a second step of, by an execution unit, virtually arranging the sensor on the measurement region map with environment information generated by the generation unit, and simulating the measurable region of the sensor based on sensor information related to the measurable region of the sensor; and a third step of, by an output unit, outputting a result of simulation by the execution unit.

According to the above configuration, the measurable region of the sensor in consideration of environment conditions is simulated and output before the sensor is actually installed, so even a user who has no experience in using a sensor can determine an optimal sensor and an installation position of the sensor according to the intended use.

Advantageous Effects of Invention

According to the present invention, a measurable region of a sensor can be appropriately simulated.

BRIEF DESCRIPTION OF DRAWINGS

FIG. 6 is a diagram illustrating an example of measurement accuracy information for environment condition according to the first embodiment.

FIG. 9 is a diagram illustrating an example of preset object information used in a measurement target object generation unit according to the first embodiment.

DESCRIPTION OF EMBODIMENTS

Hereinafter, an embodiment of the present invention will be described in detail with reference to the drawings.

(1) First Embodiment

Figure 1:
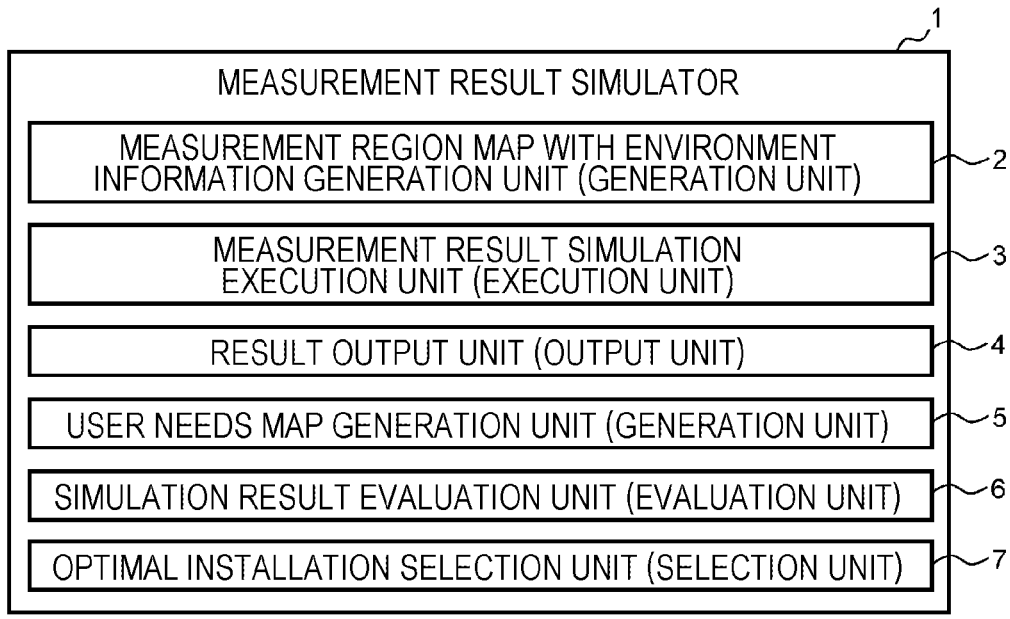
FIG. 1 is a diagram illustrating an example of a configuration of a measurement result simulator according to a first embodiment.

In FIG. 1, reference numeral 1 denotes a measurement result simulator according to a first embodiment as a whole.

The measurement result simulator 1 is a simulator that virtually arranges a sensor on a generated measurement region map, simulates the measurement results, and outputs the results to support the determination of specifications of the sensor and an installation position of the sensor for a user who has no experience in using a sensor.

The measurement result simulator 1 is an example of an information processing apparatus (computer), and is a notebook computer, a server device, a tablet terminal, or the like. The measurement result simulator 1 includes a central processing unit (CPU), a random access memory (RAM), a read only memory (ROM), a hard disk drive (HDD), and the like, which are not shown.

The measurement result simulator 1 has various functions (a measurement region map with environment information generation unit 2, a measurement result simulation execution unit 3, a result output unit 4, a user needs map generation unit 5, a simulation result evaluation unit 6, an optimal installation selection unit 7 and the like). The functions of the measurement result simulator 1 may be achieved by, for example, the CPU reading a program stored in the ROM into the RAM and executing the program (software), may be achieved by hardware such as a dedicated circuit, or may be achieved by a combination of software and hardware. Some of the functions of the measurement result simulator 1 may be achieved by another computer that can communicate with the measurement result simulator The measurement region map with environment information generation unit 2 is an example of a generation unit that generates various types of information, receives a three-dimensional model of a measurement region measured by a three-dimensional sensor, a three-dimensional model of a measurement region created by a general three-dimensional model creation tool such as a computer aided design (CAD), or the like, and generates a measurement region map on which a simulation result is superimposed.

The measurement result simulation execution unit 3 is an example of an execution unit that simulates a measurable region of the sensor, and simulates measurement results (measurable region or the like) of each sensor based on the measurement region map generated by the measurement region map with environment information generation unit 2 and sensor information of the sensor virtually arranged on the measurement region map.

The result output unit 4 is an example of an output unit that outputs various types of information, and displays a simulation result superimposed on the measurement region map. Note that, although details will be described later, for example, a measurable region of the sensor (a heat map indicating measurement accuracy or the like) is displayed.

The user needs map generation unit 5 is an example of a generation unit that generates various types of information, and generates a user needs map (a heat map indicating measurement accuracy desired by the user) in which user needs are superimposed on the map.

The simulation result evaluation unit 6 is an example of an evaluation unit that performs evaluation related to the simulation result, and calculates the degree of coincidence (similarity) between the simulation result and the user needs map. For example, the calculated degree of coincidence is displayed by the result output unit 4 as a degree of satisfaction.

The optimal installation selection unit 7 is an example of a selection unit that selects an optimal sensor and an installation position of the sensor, and selects an optimal sensor that satisfies the user needs map and an installation position of the sensor. The selected optimal sensor and the installation position of the sensor are displayed by the result output unit 4, for example.

Hereinafter, the measurement region map generation unit 2, the measurement result simulation execution unit 3, the result output unit 4, the user needs map generation unit 5, the simulation result evaluation unit 6, and the optimal installation selection unit 7 will be described in detail.

Figure 2:
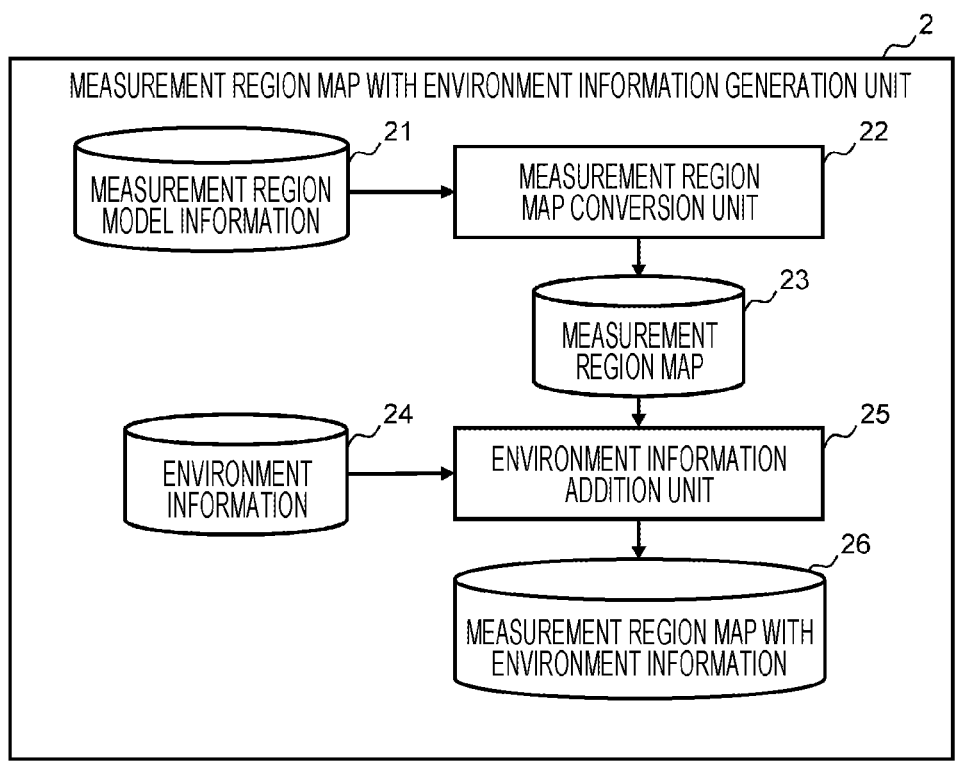
FIG. 2 is a diagram illustrating an example of a configuration of a measurement region map with environment information generation unit according to the first embodiment.

FIG. 2 is a diagram illustrating an example of a configuration of the measurement region map with environment information generation unit 2. The measurement region map with environment information generation unit 2 generates a measurement region map 23 from a model of the measurement region, and adds environment information 24 to the measurement region map 23, to generate a measurement region map with environment information 26 for superimposing the simulation result.

More specifically, the measurement region map with environment information generation unit 2 is configured to include a measurement region map conversion unit 22 and an environment information addition unit 25.

The measurement region map conversion unit 22 receives, as a measurement region model information 21, at least one or more (one or both) of a three-dimensional model (an example of shape information) of the measurement region obtained by measuring the measurement region with a three-dimensional sensor or the like and a three-dimensional model (an example of dimension information) of the measurement region created by a general three-dimensional model creation tool, and converts the three-dimensional model to the measurement region map 23 for superimposing the simulation result.

The environment information addition unit 25 outputs a measurement region map with environment information 26 in which the environment information 24 that is information of texture, light reflection performance, color or the like of each point in the measurement region is added to the measurement region map 23.

Hereinafter, the processing performed by the measurement region map generation unit 2 will be described in detail.

Figure 3:
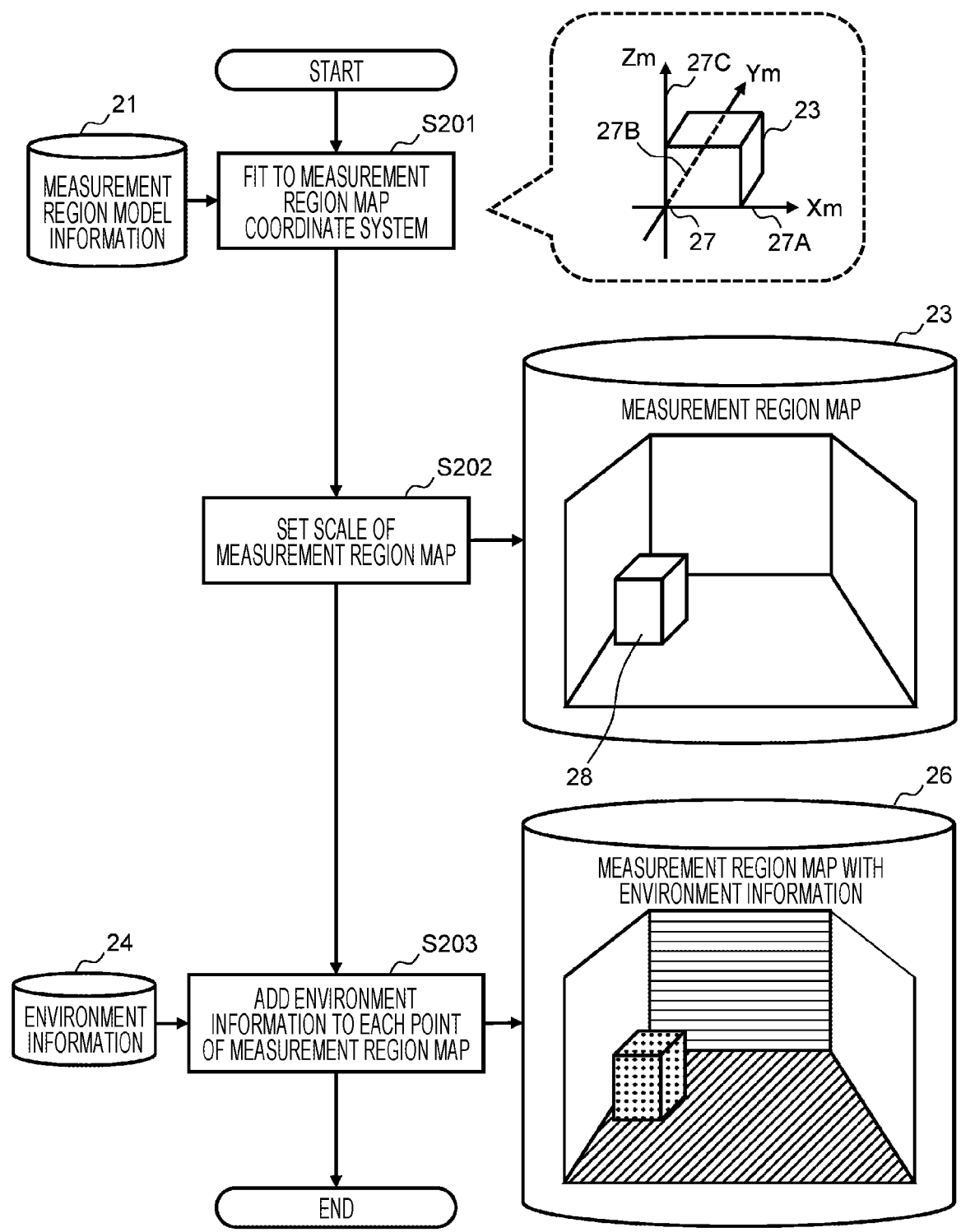
FIG. 3 is a diagram illustrating an example of a processing procedure related to processing performed by the measurement region map generation unit according to the first embodiment.

FIG. 3 is a diagram illustrating an example of a processing procedure related to processing performed by the measurement region map generation unit 2. First, the measurement region map generation unit 2 fits the measurement region model information 21 to a measurement region map coordinate system (step S201). Subsequently, the measurement region map generation unit 2 sets the scale of the measurement region model information 21 fitted to the measurement region map coordinate system 27 to generate the measurement region map 23 (step S202). Subsequently, the measurement region map generation unit 2 generates a measurement region map with environment information by adding texture, color information, or the like to each point of the measurement region map 23 with reference to the environment information 24 (step S203).

Hereinafter, steps S201 to S203 will be described in detail.

In step S201, the measurement region map conversion unit 22 sets an arbitrary measurement region map coordinate system for the shape information of the measurement region represented by the measurement region model information 21. The measurement region map coordinate system 27 includes an Xm axis 27A, a Ym axis 27B, and a Zm axis 27G.

Note that, in the example illustrated in FIG. 3, the fitting is performed such that the floor surface direction of the measurement region matches the Xm axis 27A-Ym axis 27B plane direction of the measurement region map coordinate system 27. However, the fitting method of the measurement region map coordinate system 27 is not particularly limited as long as the arbitrary position of the measurement region map 23 can be represented by the coordinate position.

In step S202, the measurement region map conversion unit 22 sets the scale of the measurement region map 23 in the measurement region map coordinate system 27 so that the measurement region in the real space corresponds to the scale. As a method of setting the scale, there is a method of photographing a board on which a predetermined pattern is drawn, and calibrating the corresponding points in the pattern from the correspondence between the coordinates of the world coordinate system in the real space and the coordinates of the measurement region map coordinate system 27. There is a method in which the user manually selects the corresponding points of the pattern, and there is no particular limitation. Note that the method of setting the scale of the measurement region map 23 is not particularly limited as long as it is a method with which the coordinates on the measurement region map coordinate system 27 can be converted to the coordinates on the world coordinate system.

In step S203, the environment information addition unit 25 adds the environment information 24 to each point of the measurement region map 23. The environment information includes, but is not particularly limited to, texture, color information, temperature, specular reflection coefficient, diffuse reflection coefficient, and the like, which are factors that change the measurement result of the sensor.

As for the method of adding (setting) the environment information 24, each value (environment information 24) may be acquired by a sensor and set. Further, the user may set each value for each point using a graphical user interface (GUI) on an application. Alternatively, the setting may be made using each value of the template stored in advance. The method of setting the environment information 24 is not particularly limited.

Note that, in a case where an installation object 28 such as a chair, a desk, or a locker exists in the measurement region map 23, the environment information 24 is also added to the installation object 28.

Figure 4:
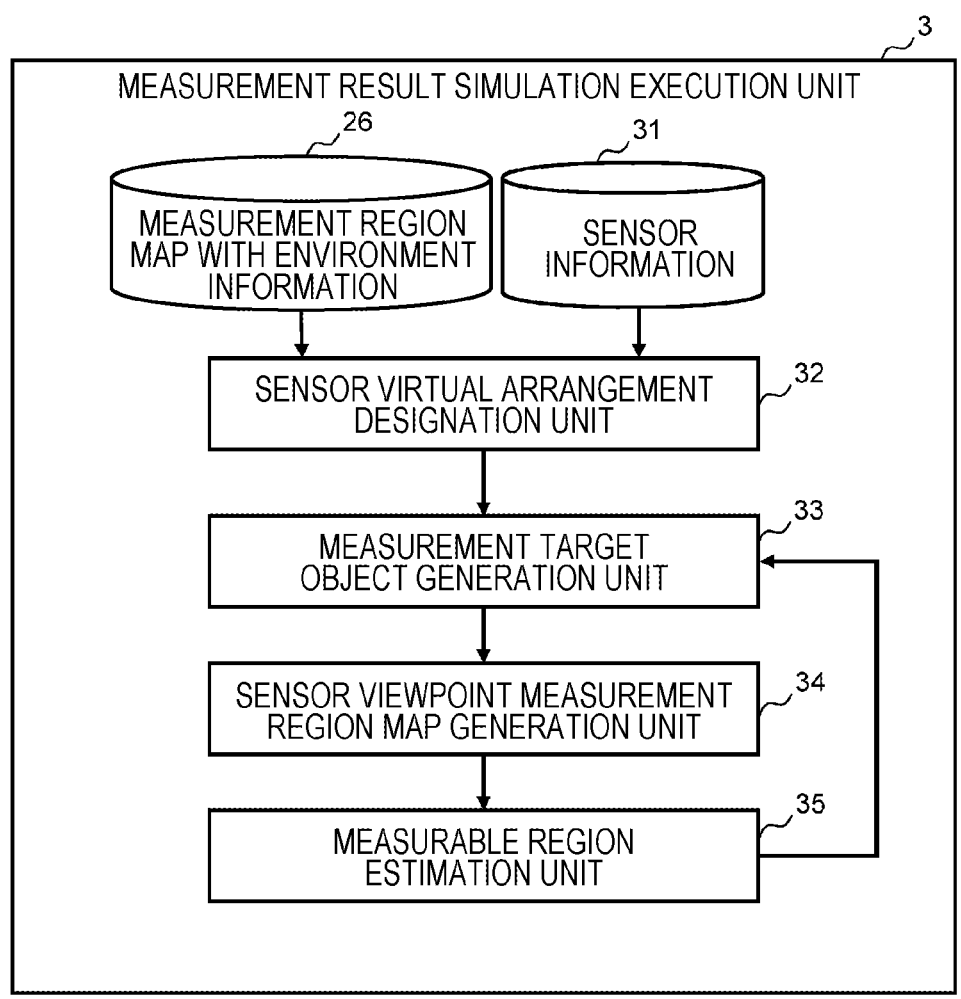
FIG. 4 is a diagram illustrating an example of a configuration of a measurement result simulation execution unit according to the first embodiment.

FIG. 4 is a diagram illustrating an example of the configuration of the measurement result simulation execution unit 3. The measurement result simulation execution unit 3 virtually arranges the sensor and an object to be measured (measurement target object) on the measurement region map with environment information 26, and estimates the measurable region of the sensor.

More specifically, the measurement result simulation execution unit 3 includes a sensor virtual arrangement designation unit 32, a measurement target object generation unit 33, a sensor viewpoint measurement region map generation unit 34, and a measurable region estimation unit 35.

The sensor virtual arrangement designation unit 32 receives the measurement region map with environment information 26 and the sensor information 31, and virtually arranges the sensors on the measurement region map with environment information 26. The measurement target object generation unit 33 virtually generates and arranges a measurement target object on the measurement region map with environment information 26. The sensor viewpoint measurement region map generation unit 34 generates a map reflecting changes in environment conditions due to external factors. The measurable region estimation unit 35 estimates the measurable region.

Hereinafter, the sensor information 31, the sensor virtual arrangement designation unit 32, the measurement target object generation unit 33, the sensor viewpoint measurement region map generation unit 34, and the measurable region estimation unit 35 will be described in detail.

Figure 5:
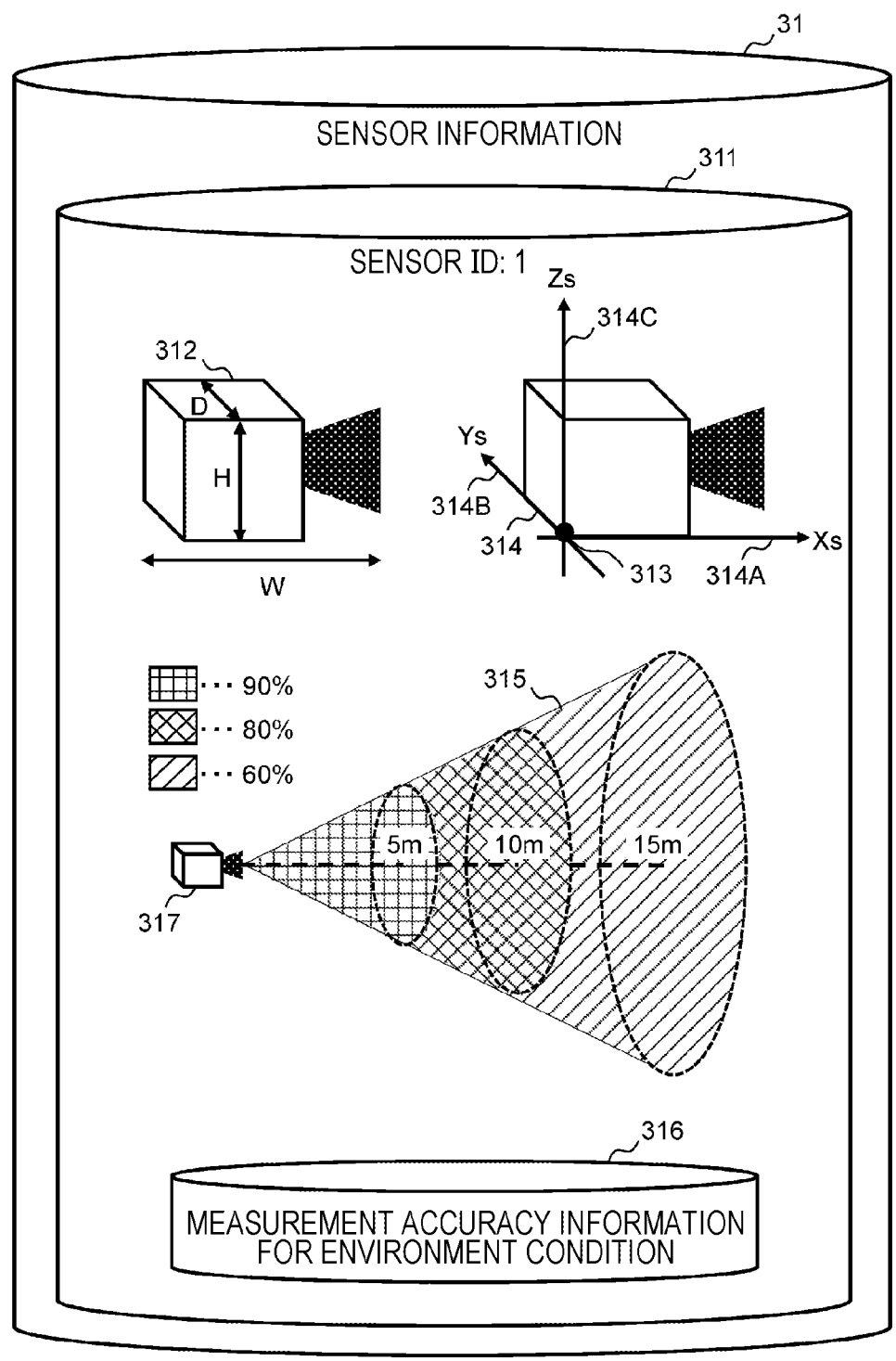
FIG. 5 is a diagram illustrating an example of sensor information according to the first embodiment.

FIG. 5 is a diagram illustrating an example of the sensor information 31. The sensor information 31 includes, for each sensor, sensor housing dimension information 312 which is information of a sensor housing dimension, a sensor representative point 313 for expressing a sensor position, and a sensor coordinate system 314 having the sensor representative point 313 as an origin, an ideal measurable region 315 indicating the measurable region in an ideal environment of the sensor, and measurement accuracy information for environment condition 316 in which a change in a measurement result caused by the environment condition is stored for each environment condition. A sensor ID is assigned to each sensor, and a sensor type (for example, sensor specification) can be identified by the sensor ID.

Hereinafter, the sensor housing dimension information 312, the sensor representative point 313, the sensor coordinate system 314, the ideal measurable region 315, and the measurement accuracy information for environment condition 316 will be described.

The sensor housing dimension information 312 is information indicating the housing dimension of the sensor. In FIG. 5, the sensor housing dimension information 312 indicates only the dimension of the width (W), height (H), and depth (D) of the sensor, but the detailed information including the dimension information for each sensor component may be used, and is not particularly limited.

The sensor representative point 313 is a point for expressing the sensor position, and is set at a corner of the sensor housing in FIG. 5, but is not particularly limited as long as it is a point in the sensor housing.

The sensor coordinate system 314 includes an Xs axis 314A, a Ys axis 314B, and a Zs axis 314C with the sensor representative point 313 as the origin.

The ideal measurable region 315 is information indicating a region where the sensor can measure in an ideal measurement environment where there is no environment condition that changes the measurement result.

The ideal measurable region 315 reflects, for example, a decrease in measurement accuracy as the distance to the measurement point increases, and is represented by a three-dimensional shape.

Here, the measurement accuracy is, for example, a detection rate of a person in the case of a sensor that recognizes a person, or a degree of an error of a distance to the measurement target in the case of a sensor that measures a distance, and varies depending on the sensor.

It can be seen that the sensor 317 illustrated in FIG. 5 has a conical ideal measurable region 315, and has a measurement accuracy of 90% in a region where the distance between the sensor and the observation point is up to 5 m, 80% in a region where the distance is from 5 m to 10 m, and 60% in a region where the distance is 10 m to 15 m. The shape of the ideal measurable region 315 can be represented by the sensor coordinate system 314.

FIG. 6 is a diagram illustrating an example of the measurement accuracy information for environment condition 316. The measurement accuracy information for environment condition 316 includes a measurement accuracy variation amount for each environment condition at a sensor measurement point. Examples of environment conditions that change the measurement accuracy of a sensor such as a camera include an RGB value representing color information of a measurement point and a texture. Examples of environment conditions that change the measurement accuracy of the sensor such as a thermal sensor is temperature. Further environment condition can be arbitrarily added. Furthermore, the environment condition may be a single environment condition or a combination of a plurality of environment conditions.

Figure 7:
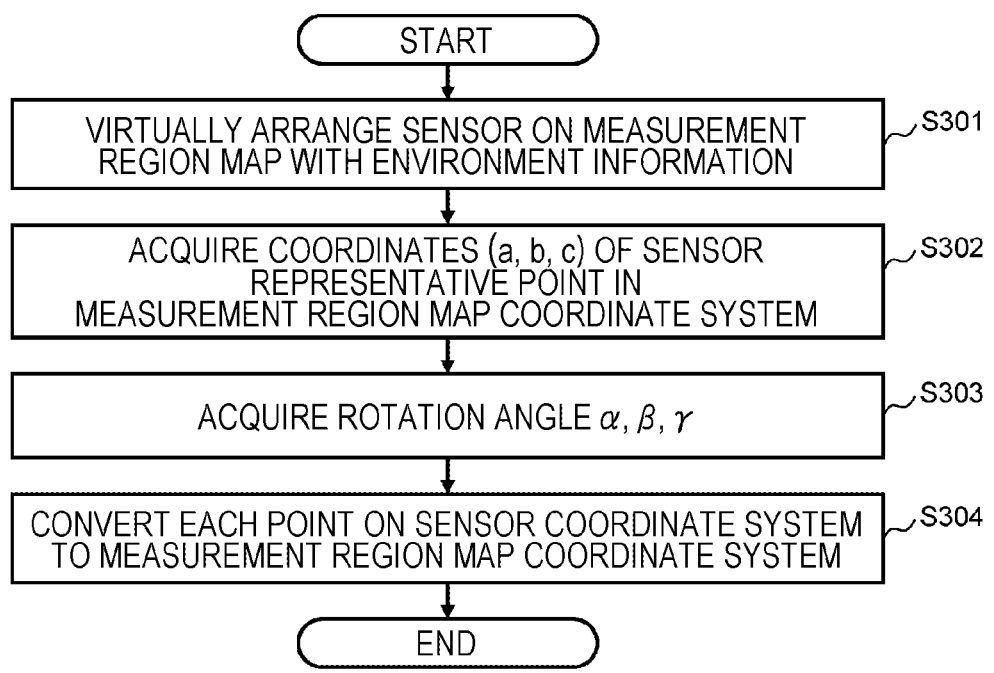
FIG. 7 is a diagram illustrating an example of a processing procedure related to processing performed by a sensor virtual arrangement designation unit according to the first embodiment.

FIG. 7 is a diagram illustrating an example of a processing procedure related to processing performed by the sensor virtual arrangement designation unit 32. First, the sensor virtual arrangement designation unit 32 virtually arranges the sensor at an arbitrary position on the measurement region map with environment information 26 (step S301). Subsequently, the sensor virtual arrangement designation unit 32 acquires the coordinates (a, b, c) of the sensor representative point 313 of the virtually arranged sensor in the measurement region map coordinate system 27 (step S302). Subsequently, the sensor virtual arrangement designation unit 32 acquires the rotation angles $\alpha$, $\beta$, $\gamma$ of each axis (step S303). Subsequently, the sensor virtual arrangement designation unit 32 converts the coordinates of the sensor coordinate system 314 into the coordinates of the measurement region map coordinate system 27 using the rotation parameters $\alpha$, $\beta$, $\gamma$ (step S304).

Hereinafter, step S301, step S303, and step S304 will be described in detail.

Figure 8:
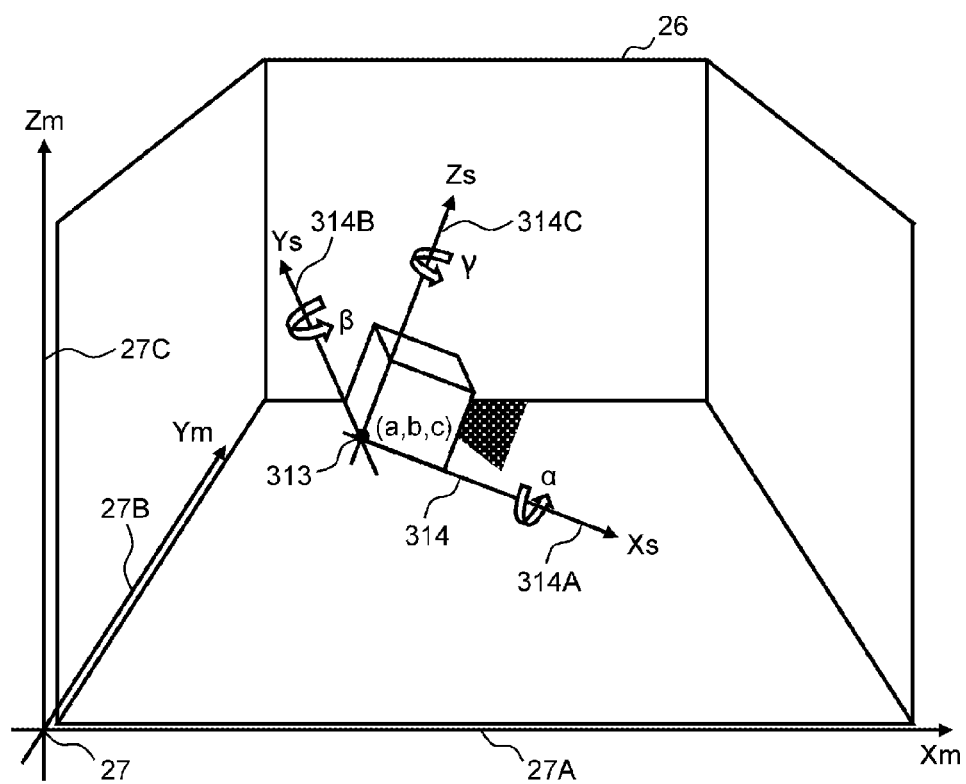
FIG. 8 is a diagram illustrating an example when a sensor is virtually arranged on a measurement region map with environment information according to the first embodiment.

In step S301, the sensor virtual arrangement designation unit 32 virtually arranges at least one or more sensors at arbitrary positions on the measurement region map with environment information 26. The arrangement position may be determined by a GUI operation, and is not particularly limited as long as the arrangement position of the virtual sensor is uniquely determined with the method. FIG. 8 illustrates an example in which the sensor is virtually arranged on the measurement region map with environment information 26. At this time, the coordinates of the sensor representative point 313 in the measurement region map coordinate system 27 are b, c).

In step S303, the sensor virtual arrangement designation unit 32 acquires the rotation angles $\alpha$, $\beta$, $\gamma$ in a case where each axis is rotated such that the respective directions of the Xs axis 314A and the Xm axis 27A, the Ys axis 314B and the Ym axis 27B, and the Zs axis 314C and the Zm axis 27C match. As a method of determining the rotation angles $\alpha$, $\beta$, $\gamma$, there is a method of exhaustively varying the rotation angles, and the method is not particularly limited.

In step S304, the sensor virtual arrangement designation unit 32 converts the coordinates of the point represented by the sensor coordinate system 314 into the coordinates of the measurement region map coordinate system 27. The conversion of the coordinates can be performed by using the rotation angles $\alpha$, $\mu$, $\gamma$. A point on the sensor coordinate system 314 can be converted to coordinates of the measurement region map coordinate system 27 by rotating by $\alpha$ about the Xs axis 314A, $\beta$ about the Ys axis 314B, and $\gamma$ about the Zs axis 314C.

As a method of coordinate conversion, the following conversion formula is generally used, and there is no particular limitation for the method.

$$\begin{pmatrix} x' \\ y' \\ z' \\ 1 \end{pmatrix} = \begin{pmatrix} 1 & 0 & 0 & 0 \\ 0 & \cos\alpha & -\sin\alpha & 0 \\ 0 & \sin\alpha & \cos\alpha & 0 \\ 0 & 0 & 0 & 1 \end{pmatrix} \begin{pmatrix} x \\ y \\ z \\ 1 \end{pmatrix} + \begin{pmatrix} a \\ b \\ c \\ 1 \end{pmatrix} \quad \text{[Mathematical Formula 1]}$$

-continued $$\begin{pmatrix} x' \\ y' \\ z' \\ 1 \end{pmatrix} = \begin{pmatrix} \cos\beta & 0 & \sin\beta & 0 \\ 0 & 1 & 0 & 0 \\ -\sin\beta & 0 & \cos\beta & 0 \\ 0 & 0 & 0 & 1 \end{pmatrix} \begin{pmatrix} x \\ y \\ z \\ 1 \end{pmatrix} + \begin{pmatrix} a \\ b \\ c \\ 1 \end{pmatrix}$$

$$\begin{pmatrix} x' \\ y' \\ z' \\ 1 \end{pmatrix} = \begin{pmatrix} \cos\gamma & -\sin\gamma & 0 & 0 \\ \sin\gamma & \cos\gamma & 0 & 0 \\ 0 & 0 & 1 & 0 \\ 0 & 0 & 0 & 1 \end{pmatrix} \begin{pmatrix} x \\ y \\ z \\ 1 \end{pmatrix} + \begin{pmatrix} a \\ b \\ c \\ 1 \end{pmatrix}$$

According to the processing in step S304, the orientation of the sensor and the ideal measurable region 315 in the measurement region map coordinate system 27 can be expressed.

The measurement target object generation unit 33 virtually generates a measurement target object and arranges the measurement target object at an arbitrary position on the measurement region map with environment information 26 specified by the user. The arrangement position of the virtual object may be specified by static coordinates or a data sequence in which the coordinate is arranged in time series, and is not particularly limited.

FIG. 9 is a diagram illustrating an example of preset object information used in the measurement target object generation unit 33. The measurement target object generation unit 33 records preset object information.

The preset object information includes at least information indicating a shape for each measurement target object. The shape may be recorded as a three-dimensional model composed of general dimensions of the measurement target object, and the format is not particularly limited as long as the shape of the measurement target object can be expressed. Note that the user can arbitrarily change the shape by GUI, numerical value input, or the like.

The preset object information may include object information such as an RGB value and texture. The object information may be information that is uniformly applied to the entire object or information that is applied to each point of the measurement target object, and is not particularly limited. In addition to the preset object information, the object information of the object to be measured which is defined by the user may be input.

The sensor viewpoint measurement region map generation unit 34 models an object that changes the measurement region map with environment information 26 such as a light source and a heat source, renders the measurement region map with environment information 26 observed from the sensor viewpoint, and generates the sensor viewpoint measurement region map 342.

Figure 10:
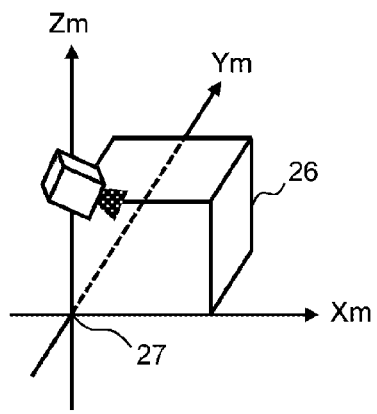
FIG. 10 is a diagram illustrating an example in which a light source model obtained by modeling a light source is arranged on the measurement region map with environment information according to the first embodiment.
Figure 10:
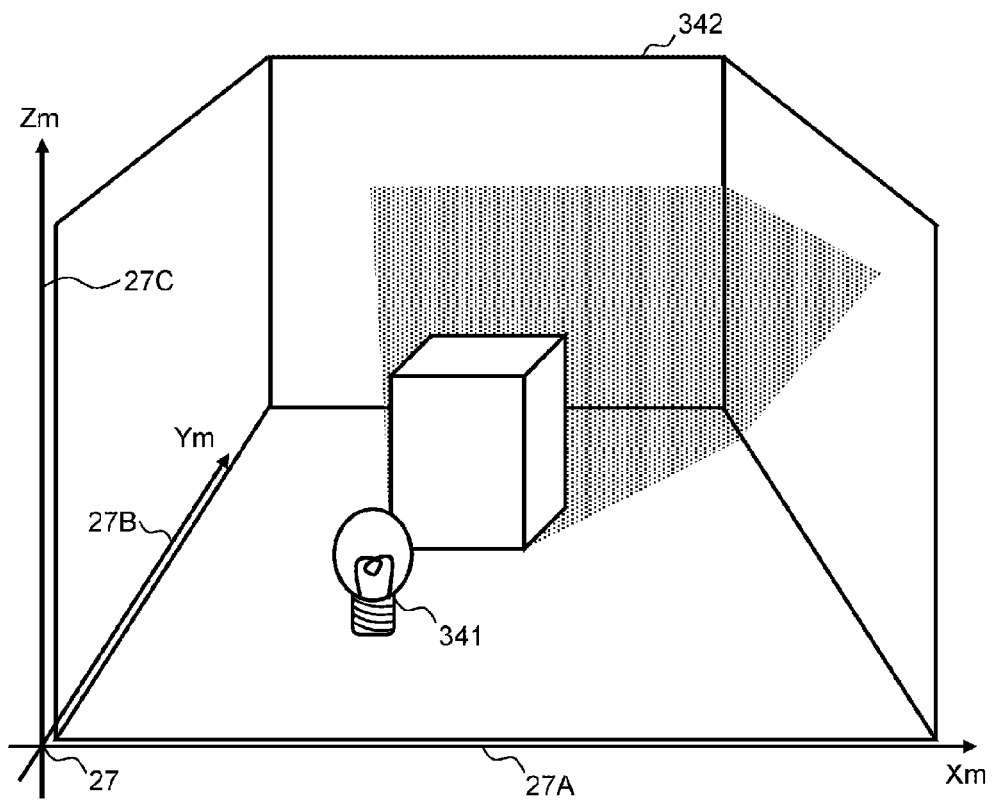

FIG. 10 is a diagram illustrating an example in which a light source model 341 obtained by modeling a light source is arranged on the measurement region map with environment information 26. As the light source model 341, for example, a general point light source model in computer graphics can be used, but is not particularly limited. The position of the light source model 341 can be set by the user through GUI, numerical input, or the like, and the position and method are not particularly limited.

Depending on the light source model 341, the luminance, color information, and the like of each point of the virtual object change. A shadow is generated because the light emitted from the light source model 341 is blocked by the virtual object, and this is also changed by a point on the measurement region map with environment information 26. Since the change of each point due to the influence of the light source model 341 is unique for each observation point, the sensor viewpoint measurement region map generation unit 34 generates the sensor viewpoint measurement region map 342 for the viewpoint of each sensor virtually arranged on the measurement region map with environment information 26 by the sensor virtual arrangement designation unit 32. A method for generating the sensor viewpoint measurement region map 342 measured from each sensor viewpoint may be a general rendering method in computer graphics, and is not particularly limited.

Figure 11:
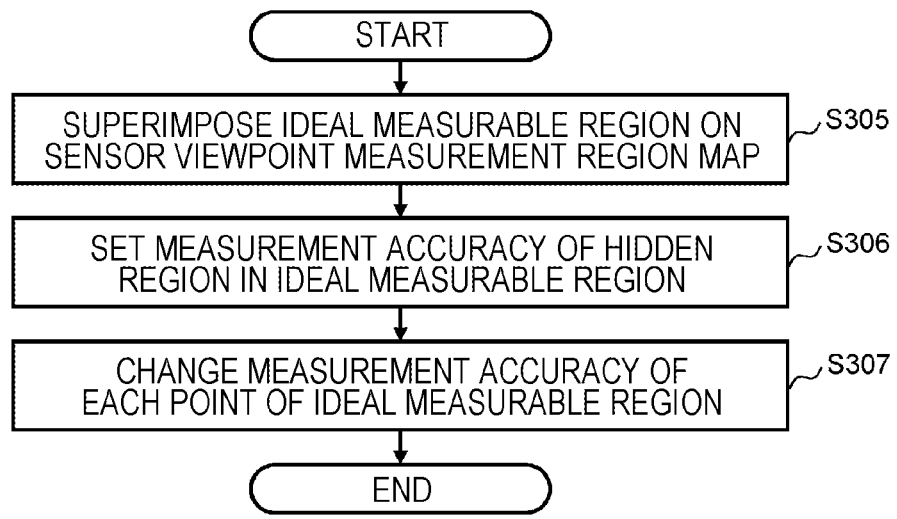
FIG. 11 is a diagram illustrating an example of a processing procedure related to processing performed by a measurable region estimation unit according to the first embodiment.

The measurable region estimation unit 35 estimates the measurable region of the sensor. FIG. 11 is a diagram illustrating an example of a processing procedure according to processing performed by a measurable region estimation unit 35. The measurable region estimation unit 35 first superimposes the ideal measurable region 315 of the sensor on the sensor viewpoint measurement region map 342 (step S305). Next, the measurable region estimation unit 35 changes the measurement accuracy of a hidden region due to shielding (step S306). Next, the measurable region estimation unit 35 changes the measurement accuracy of each point in the ideal measurable region 315 (step S307).

Hereinafter, step S306 and step S307 will be described in detail.

Step S306 will be described with reference to FIG. 12. In step S306, the measurable region estimation unit 35 obtains the shape of the sensor viewpoint measurement region map 342, and the hidden region 351 shielded by the virtual object, and sets the measurement accuracy of the hidden region 351. The hidden region 351 indicates, for example, a region that cannot be seen from the sensor.

Figure 12:
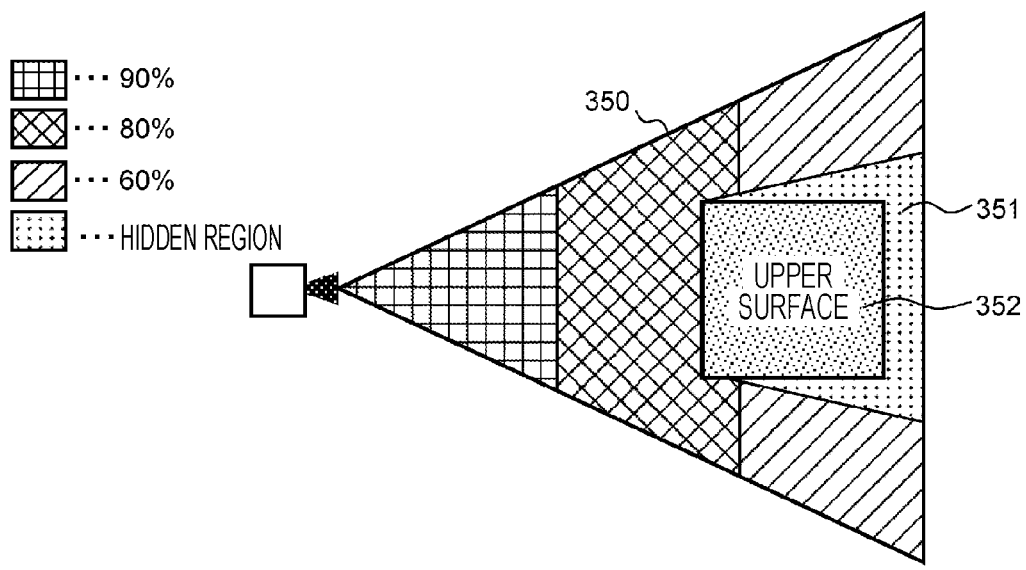
FIG. 12 is a schematic view of a scene in which a cubic object is arranged in an ideal measurable region according to the first embodiment, as observed from above.

FIG. 12 is a schematic view of a scene in which a cubic object 352 is virtually arranged in the ideal measurable region 350 superimposed on the sensor viewpoint measurement region map 342, as observed from above. The region blocked by the object 352 and becoming a blind spot of the sensor is the hidden region 351. The measurable region estimation unit 35 changes the measurement accuracy of the hidden region 351 in the ideal measurable region 350. In a general sensor, the measurement accuracy with respect to the sensor blind spot is 0%, but the measurement accuracy of the hidden region 351 is not particularly limited.

Figure 13:
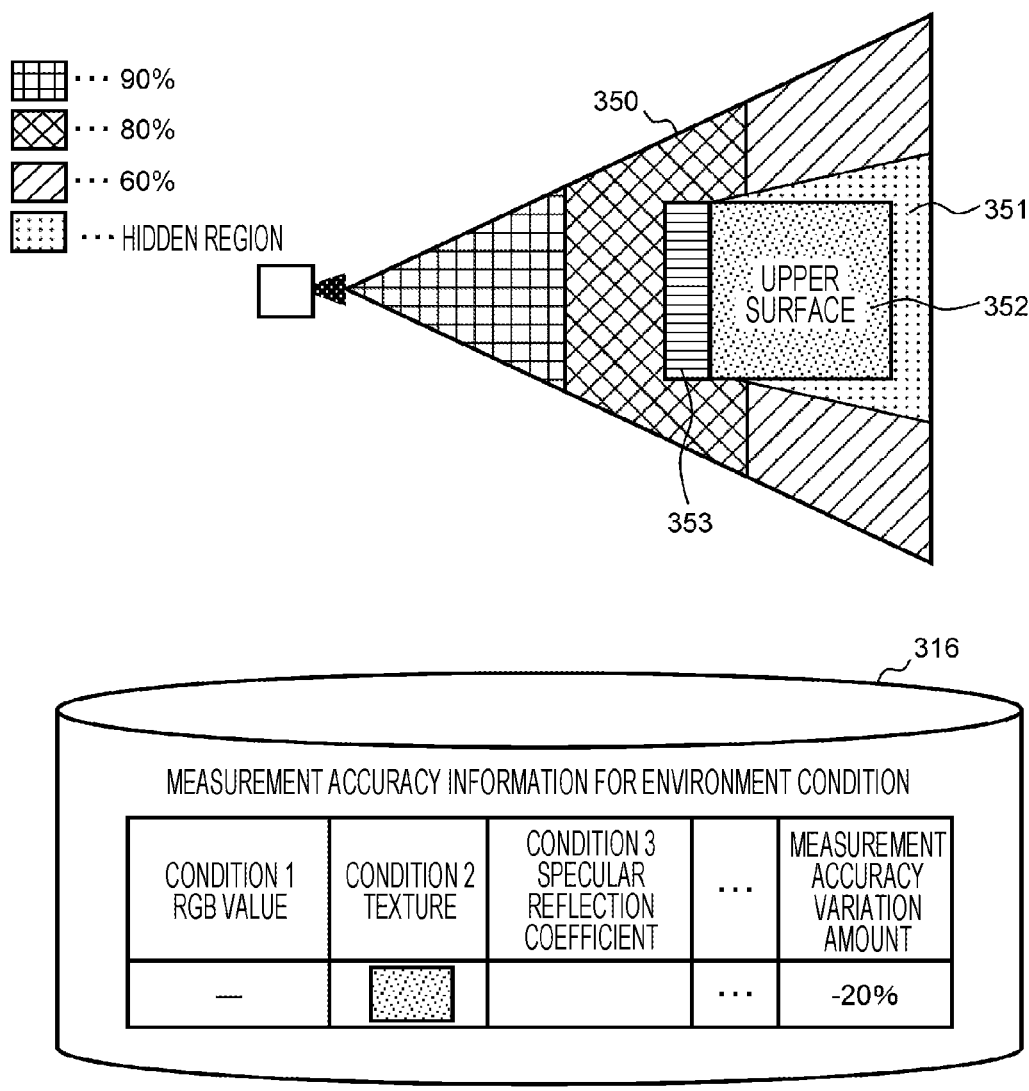
FIG. 13 is a schematic diagram of a scene in which a cubic object is arranged in the ideal measurable region according to the first embodiment, as observed from above and a diagram illustrating measurement accuracy information for environment condition of the sensor.

Step S307 will be described with reference to FIG. 13. FIG. 13 illustrates a schematic view of a scene in which a cubic object 352 is virtually arranged in the ideal measurable region 350, as observed from above, and the measurement accuracy information for environment condition 316 of the sensor.

The measurable region estimation unit 35 acquires, for each point of the ideal measurable region 350, the corresponding environment condition of the sensor viewpoint measurement region map 342. Then, the measurable region estimation unit refers to the measurement accuracy information for environment condition 316 and comprehensively determines whether or not each point satisfies the environment condition. If there is a point that satisfies the environment condition, the measurable region estimation unit 35 varies (changes) the measurement accuracy of the ideal measurable region 350 by the measurement accuracy variation amount of the measurement accuracy information for environment condition 316.

In the example of FIG. 13, a part of the region of the ideal measurable region 350 is in contact with the virtual object 352. Referring to the measurement accuracy information for environment condition 316 of the sensor, since the measurement accuracy variation amount is −20% for the same texture as the object 352, the measurement accuracy of the region 353 where the ideal measurable region 350 and the virtual object 352 are in contact with each other is changed from 80% to 60%. In addition, for convenience of explanation, the region 353 is illustrated with a thickness for easy understanding.

The result output unit 4 displays the simulation result (measurable region) acquired by the above-described processing on a display (not shown) or the like. The display of the simulation result is generally displayed using a GUI, and is not particularly limited.

For example, the measurable region of the sensor viewpoint measurement region map 342 corresponding to each sensor may be displayed so as to be switchable. According to this display, the measurable region of the sensor can be individually grasped. Further, for example, all of the measurable regions of the sensor viewpoint measurement region map 342 corresponding to each sensor may be displayed all at once. According to this display, the final installation mode of the sensor can be grasped.

According to the display of the measurable region, for example, the user can grasp the measurement accuracy of a space in which brightness, which is difficult to grasp, is taken into consideration.

As described above, by simulating the measurement result of the sensor based on the map information of the measurement region acquired in advance, the environment information, and the installation condition of the sensor, and presenting the effect before actually installing the sensor, it is possible to support even a user who has no experience in using a sensor to determine an optimal sensor (for example, sensor specifications) and an installation position according to the intended use.

The user needs map generation unit 5 receives an input of a user needs map (such as a heat map) desired by the user, and generates a user need map. The input method is not particularly limited. For example, the measurement accuracy is input for each point using a GUI on an application.

Figure 14:
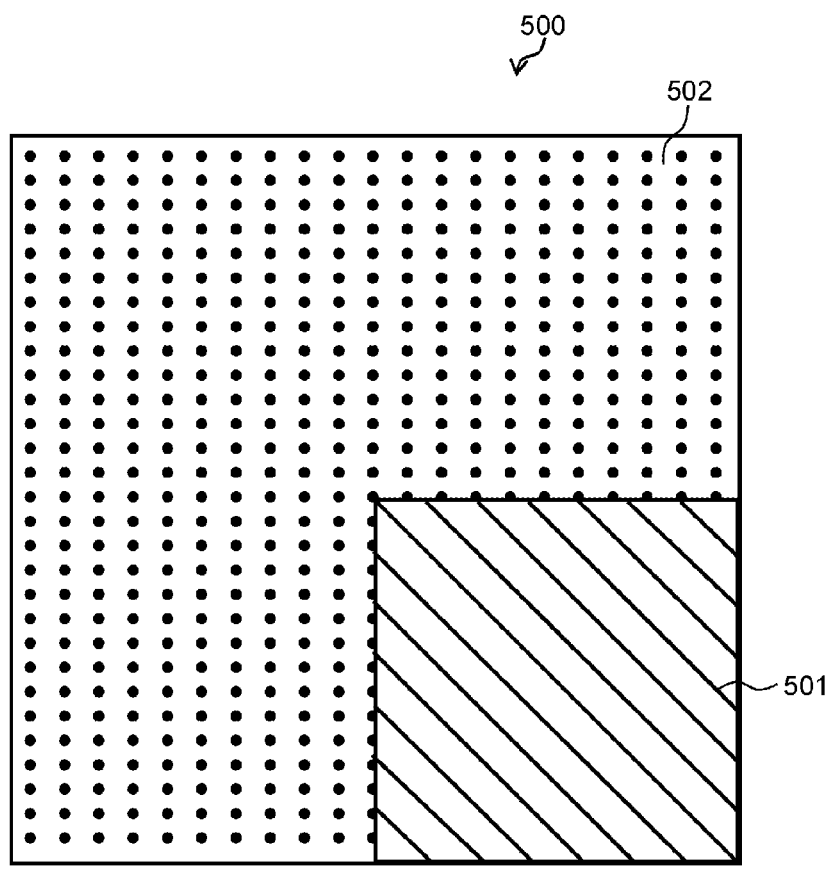
FIG. 14 is a schematic diagram of a user needs map according to the first embodiment, as observed from above.

FIG. 14 is a schematic diagram of a user needs map 500 indicating a room to be measured, as observed from above. A first region 501 on the user needs map 500 indicates a region that the user wants to monitor intensively (the region where the measurement accuracy is a first value), and a second region 502 indicates a region that the user wants to monitor but not so much accuracy is required (a region where the measurement accuracy a second value lower than the first value).

Note that, although FIG. 14 illustrates an example in which the user needs map 500 is identified with two levels of measurement accuracy, the user needs map 500 may be identified with three or more levels.

The simulation result evaluation unit 6 calculates the degree of coincidence between the simulation result and the user needs map while the user virtually arranges the sensor. As described above, an evaluable process is provided, so that the user can more quickly and appropriately determine the optimal sensor for the measurement target and the installation position of the sensor.

When the user needs map is generated by the user needs map generation unit 5, the optimal installation selection unit 7 creates a measurable region when a predetermined sensor is virtually arranged at a predetermined position, calculates the degree of coincidence between the measurable region and the user needs map, and determines whether or not the degree of coincidence exceeds a threshold. When determining that the degree of coincidence does not exceed the threshold, the optimal installation selection unit 7 changes the virtual sensor or the arrangement of the virtual sensor, performs the above processing, and when determining that the degree of coincidence exceeds the threshold, specifies the virtual sensor and its arrangement at that time as the optimal sensor and installation position. Note that the number of sensors that are virtually arranged is not limited to one, but may be plural.

As described above, the virtual sensor and its arrangement are comprehensively changed, and the combination having the degree of coincidence exceeding the threshold is specified. According to such a configuration, the user can easily grasp the optimal sensor and the installation position of the sensor.

Note that, in the present embodiment, the case has been described as an example where the measurement region map generated by the measurement region map with environment information generation unit 2 is a map having three-dimensional information. However, a two-dimensional map may be used as long as the map has a sufficient function for displaying the measurement result of the sensor, and there is no particular limitation. In the present embodiment, the measurement target in the measurement is not particularly limited and may be a person, a cargo, a vehicle, a robot or the like as long as it can be expressed on the simulator.

According to the present embodiment, the measurable region of the sensor can be appropriately simulated, so that even a user who has no experience in using a sensor can determine an optimal sensor (for example, sensor specifications) and an installation position according to the intended use.

(2) Other Embodiments

Note that in the above-described embodiment, a case has been described in which the present invention is applied to the measurement result simulator 1. However, the present invention is not limited to this, and can be widely applied to various other information processing apparatuses.

Further, in the above-described embodiment, the case has been described where the result output unit 4 displays the simulation result and the like, but the present invention is not limited to this, and the result output unit 4 may print the simulation result and the like, transmit the simulation result and the like to a client terminal specified in advance, store the simulation result or the like in a predetermined storage device as a file, or perform other output.

Further, the above-described configuration may be changed, rearranged, combined, or omitted as appropriate without departing from the gist of the present invention.

Further, information such as programs, tables, files, and the like that achieve each function in the above description can be stored in a storage device such as a memory, a hard disk, or a solid state drive (SSD), a storage medium such as an TC card, an SD card, or a DVD, or an information processing apparatus communicably connected via a network.

REFERENCE SIGNS LIST 1 measurement result simulator
2 measurement region map with environment information generation unit
3 measurement result simulation execution unit
4 result output unit
5 user needs map generation unit
6 simulation result evaluation unit
7 optimal installation selection unit

The invention claimed is:

1. An information processing apparatus that simulates a measurable region of a sensor when the sensor is arranged in a measurement region to be measured, the information processing apparatus comprising:

a processor configured to generate a measurement region map with environment information based on a three-dimensional model of the measurement region to be measured and environment information that causes a change in a measurement result of the sensor, the environment information including texture, color information, temperature, a reflection coefficient, and a diffuse reflection coefficient;

virtually arrange the sensor on the measurement region map with environment information that is generated, and simulate the measurable region of the sensor based on sensor information related to the measurable region of the sensor;

output a result of simulation;

generate a user needs map in which user needs are superimposed on a map; and evaluate a degree of coincidence between the simulation result and the user needs map that is generated, and, when the degree of coincidence exceeds a threshold, specify the sensor as the optimal sensor, and specify the sensor arrangement as the optimal installation position of the sensor, wherein the user needs map is identified with three or more levels of measurement accuracy.

2. The information processing apparatus according to claim 1, wherein the processor is configured to virtually arrange a sensor at an arbitrary position on the measurement region map with environment information.

3. The information processing apparatus according to claim 1, wherein the processor is configured to virtually arrange a measurement target object on the measurement region map with environment information.

4. The information processing apparatus according to claim 1, wherein the processor is configured to reflect a change in environment conditions caused by influence of an object that changes the measurement region map with environment information, for each point of the measurement region map with environment information.

5. The information processing apparatus according to claim 1, wherein the processor is configured to generate a sensor viewpoint measurement region map measured from a viewpoint, for the viewpoint of the sensor virtually arranged on the measurement region map with environment information.

6. The information processing apparatus according to claim 5, wherein the sensor information includes an ideal measurable region indicating a measurable region in an ideal environment of the sensor, and measurement accuracy information for environment condition indicating a variation amount of measurement accuracy corresponding to an environment condition.

7. The information processing apparatus according to claim 6, wherein the processor is configured to superimpose the ideal measurable region on a sensor viewpoint measurement region map generated by the processor.

8. The information processing apparatus according to claim 7, wherein the processor is configured to estimate a hidden region in the ideal measurable region, and change measurement accuracy of the hidden region to 0%.

9. The information processing apparatus according to claim 8, wherein the processor is configured to change the measurement accuracy of the ideal measurable region based on the measurement accuracy information for environment condition.

10. The information processing apparatus according to claim 1, wherein the processor includes a measurement region map converter configured to convert the three-dimensional model into a measurement region map, and an environment information adder configured to add the environment information to each point of the measurement region map converted by the measurement region map converter to generate a measurement region map with environment information.

11. The information processing apparatus according to claim 1, wherein the three-dimensional model of the measurement region to be measured includes one or both of dimension information of the measurement region and shape information of the measurement region.

12. The information processing apparatus according to claim 1, wherein the processor is configured to select a measurable region that satisfies the user needs map generated by the user needs map that is generated, and specify information on a sensor that is the measurable region that has been selected and an installation position of the sensor.

13. A measurable region simulation method that simulates a measurable region of a sensor when the sensor is arranged in a measurement region to be measured, the measurable region simulation method comprising:

generating a measurement region map with environment information based on a three-dimensional model of the measurement region to be measured and environment information that causes a change in a measurement result of the sensor, the environment information including texture, color information, temperature, a reflection coefficient, and a diffuse reflection coefficient;

virtually arranging the sensor on the measurement region map with environment information generated by a processor, and simulating the measurable region of the sensor based on sensor information related to the measurable region of the sensor;

outputting a result of simulation;

generating a user needs map in which user needs are superimposed on a map; and evaluating a degree of coincidence between the simulation result and the user needs map, and, when the degree of coincidence exceeds a threshold, specifying the sensor as the optimal sensor, and specifying the sensor arrangement as the optimal installation position of the sensor, wherein the user needs map is identified with three or more levels of measurement accuracy.

\* \* \* \* \*